United States Patent [19]

Sase et al.

[11] 4,178,554

[45] Dec. 11, 1979

[54] PHASE DIFFERENCE DETECTOR

[75] Inventors: Takashi Sase, Hitachi; Kazuo Katoh, Tokai; Takeshi Hirayama, Mito, all of Japan

[73] Assignee: Hitachi, Ltd., Japan

[21] Appl. No.: 844,989

[22] Filed: Oct. 25, 1977

[30] Foreign Application Priority Data

Oct. 25, 1976 [JP] Japan .................................. 51-128613

[51] Int. Cl.² .......................... H03K 5/20; H03K 3/86
[52] U.S. Cl. .................................... 328/133; 307/232; 328/55
[58] Field of Search .......................... 328/133, 134, 55; 307/232

[56] References Cited

U.S. PATENT DOCUMENTS

| | | | |
|---|---|---|---|
| 3,328,688 | 6/1967 | Brooks | 328/133 X |
| 3,430,148 | 2/1969 | Miki | 307/232 X |
| 3,521,172 | 7/1970 | Harmon | 328/133 |
| 3,600,690 | 8/1971 | White | 328/133 |
| 3,987,365 | 10/1976 | Okada | 328/133 |
| 4,037,116 | 7/1977 | Hodama | 328/133 X |

*Primary Examiner*—John S. Heyman
*Attorney, Agent, or Firm*—Craig and Antonelli

[57] ABSTRACT

There is provided a pair of flip-flops, each of which is set before appearance of every one of two input signals to be compared. One of the input signals is applied to a reset terminal of the first flip-flop through an inverter, and the other input signal to that of the second flip-flop through another inverter. There is further provided a pair of AND gates. A set output of the first flip-flop is led to one of two input terminals of the first AND gate through a delay element, and a reset output of the second flip-flop is connected to the other input terminal of the first AND gate directly. The set output of the output of the second flip-flop is coupled to one of two input terminals of the second AND gate through another delay element and the reset output of the first flip-flop is connected to the other input terminal second AND gate directly.

5 Claims, 5 Drawing Figures

PHASE DIFFERENCE DETECTOR

BACKGROUND OF THE INVENTION

1. Field of the Invention

The present invention relates to a phase difference detector, which can detect even a very small phase difference between two signals being compared while having no effects upon sources of the signals.

2. Description of Prior Arts

U.S. Pat. No. 3,328,688 issued to Brooks on June 27, 1967 shows the phase difference detector, in which there is provided a pair of flip-flops. One of the two input signals is led to a set terminal of one of the flip-flops through an inverter and directly to a set terminal of the other flip-flops. The other input signal is applied to a clear terminal of the one flip-flop directly and to a clear terminal of the other flip-flop through another inverter. Both set outputs of these flip-flops are given to an AND gate and both reset outputs thereof to another AND gate. In such arrangement, the trailing edge of the one input signal is compared in the one flip-flop with the leading edge of the other input signal, and the leading edge of the one input signal is compared in the other flip-flop with the trailing edge of the other input signal. When the one input signal leads the other input signal, an output signal appears at an output terminal of the AND gate, while in the opposite case the output is produced at an output terminal of the other AND gate. The patent to Brooks can provide such a phase detector as has a zero output for a matched phase condition. This phase detector, however, has various disadvantages as discussed below.

If the phase difference between the two input signals to be compared becomes extremely small, e.g. less than one nanosecond, the phase detector as mentioned above can no longer detect the difference, that is to say, it has a nonsensitive zone for such a small phase difference. This results from the delay time which always occurs in each of the logic elements when the signal passes therethrough. The delay of this kind is unavoidable, even if logic elements with high responsibility are used. According to the inventors' experience, when a so-called Transistor Transistor Logic (TTL) element was used, the detectable phase difference was to the extent of six nanoseconds. This capability can not be heightened more than one nanosecond even by making use of an Emitter Coupled Logic (ECL) element which is generally regarded as the highest speed one among the logic elements used practically at present.

Further, there is a second disadvantage in that, as is clear from the above description of the arrangement, every input signal must drive two loads. In other words, the two flip-flops are connected in parallel to the one signal source. In this circuit arrangement, therefore, the leading edge and the trailing one of the input signal are delayed or distorted, since the load is quite heavy, and such delay or distortion in the waveform of the input signal depends on the load. This delay or distortion results in a serious error of the phase difference detection. Accordingly, for the purpose of the detection of an extremely small phase difference, it is most desirable that the load against the signal source be as light as possible.

Japanese laid-open patent application 50-156969 published on Dec. 18, 1975 provides a phase detector of another type. In this phase detector, one of the two input signals is compared in a first comparator with a signal which is delayed by a predetermined time with respect to the other input signal, and a second comparator compares the other input signal with a signal which is delayed by a predetermined time with respect to the one input signal. According to this detector, when the one input signal leads the other input signal, the first comparator produces an output pulse, and when the other input signal leads the one input signal, the second comparator produces the output pulse. The width of the output pulse, in both cases, is equal to the sum of the phase difference between the two input signals and the predetermined delay time. If, therefore, the phase difference is zero, the first and second comparators produce simultaneously the output pulses and width of which is equal to each other and to the predetermined delay time. Accordingly, the phase difference can be detected without any nonsensitive zone, no matter how small the difference may be.

This phase detector, however, has the same disadvantage as described as the second disadvantage in the patent to Brooks, because the two load are connected in parallel to one signal source.

In addition to the Japanese laid-open patent application mentioned above, the phase difference detector or phase comparators which have the delay elements are disclosed in following two U.S. patents, so far as the inventors know:

U.S. Pat. No. 3,521,172 issued to G. L. Harmon on July 21, 1970 "Binary Phase Comparator"

U.S. Pat. No. 3,600,690 issued to C. G. White on Aug. 17, 1971 "Phase Difference Detectors"

In essence, the circuit arrangements of both U.S. patents described above are similar to that of the Japanese laid-open patent application 50-15696. Accordingly, these also have the disadvantage that the load against the signal source is heavy.

SUMMARY OF THE INVENTION

An object of the present invention is to provide a phase difference detector which has no nonsensitive zone for any input signals and is light in load against the input signal source.

To accomplish this and other objects of the present invention a phase difference detector which comprises a pair of bistable elements, each of which is kept in a first state in advance before the appearance of an input signal and reversed into the second state upon application of the input signal, and means for detecting the coincidence of a second-state output of one of the bistable elements and a signal delayed by a predetermined time with respect to a first-state output of the other bistable element.

DETAILED DESCRIPTION OF THE PREFERRED EMBODIMENTS

Figure 1:
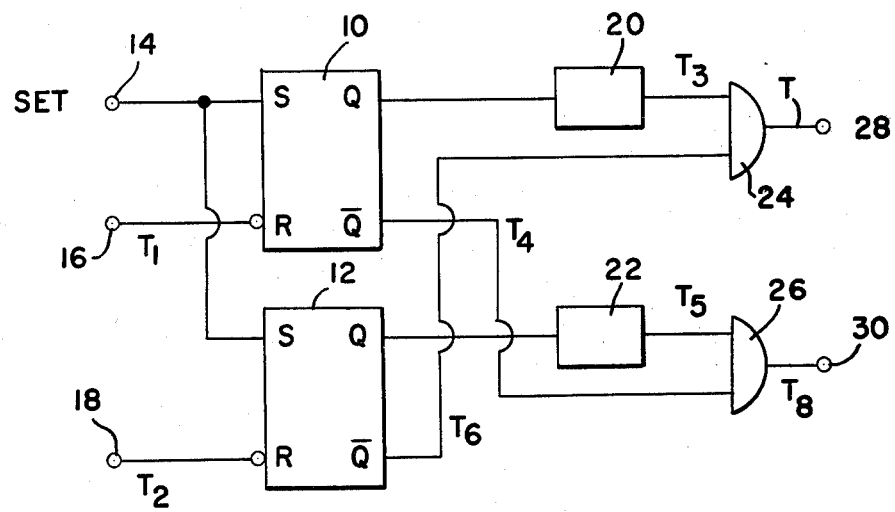
FIG. 1 shows a schematic diagram of a phase difference detector according to an embodiment of the present invention.

Referring, first of all, to FIG. 1, there is provided a pair of bistable elements, e.g. flip-flops 10 and 12, each of which has a set and a reset terminal (called S and R terminals respectively, hereinafter). The S terminals of both flip-flops 10 and 12 are connected together to a terminal 14 to which a set pulse SET is applied. The R terminal of the flip-flop 10 is connected through a inverter to a terminal 16 to which one of two input pulses to be compared, i.e. $T_1$, is applied. As usual, however, the inverter is represented only by a small circle on the R terminal. It should be noted that the flip-flop 10 is reset by the trailing edge of the pulse $T_1$ because the pulse $T_1$ coupled to the R terminal of the flip-flop 10 through the inverter. In the same manner, the R terminal of the flip-flop 12 is connected through another inverter to a terminal 18 to which the other input pulse $T_2$ is applied.

Each of the flip-flops 10 and 12 has a set and a reset output terminal (called Q and $\overline{Q}$ terminals respectively, hereinafter). As is well known, an output signal appears at the Q terminal, when the flip-flop 10 or 12 is kept in the set state, and at the $\overline{Q}$ terminal, when the flip-flop 10 or 12 remains in the reset state. The output signals which appear at the Q terminals, i.e. the set-state outputs, of the flip-flops 10 and 12 are led to delay elements 20 and 22, respectively. The delay elements 20 and 22 have a predetermined delay time d, so that the set-state output of the flip-flop 10 or 12 is delayed by the time d. The output signals of the delay elements 20 and 22 are indicated by $T_3$ and $T_5$, respectively. The signal $T_3$ is led to one of two input terminals of an AND gate 24 and the signal $T_5$ to one of two input terminals of an AND gate 26.

The output signal which appears at the $\overline{Q}$ terminal, i.e. the reset-state output $T_4$, of the flip-flop 10 is applied to the other input terminal of the AND gate 26, and the reset-state output $T_6$ of the flip-flop 12 is led to the other input terminal of the AND gate 24. Accordingly, the AND gate 24 produces the output $T_7$ at an output terminal 28, when the signals $T_3$ and $T_6$ exists simultaneously, and the AND gate 26 produces the output $T_8$ at an output terminal 30, when the signal $T_4$ coincides with the signal $T_5$.

Figure 2:
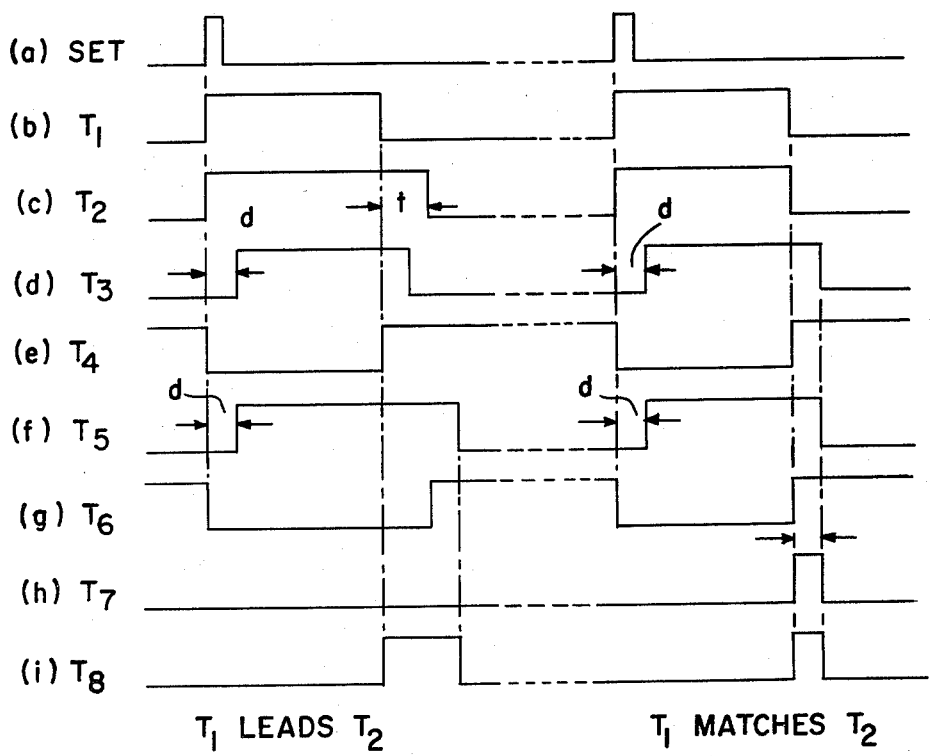
FIG. 2 is a time chart indicating the operation of the embodiment shown in FIG. 1.

The operation of the phase difference detector mentioned above will be explained by reference to FIG. 2, hereinafter. The explanation of the operation is done of the case in which the phase difference detector detects the phase difference between the trailing edges of input pulse signals as shown in FIGS. 2(b) and (c). To cite an example, such a phase difference detector can be utilized as a time difference detector in a so-called Phase Looked Loop (PLL). Such a PLL is used, for example, in an ultrasonic wave flow meter. The description of such a PLL and flow meter, however, is omitted here for the purpose of the clear explanation of the present invention.

Referring now to various wave forms (a) to (i) shown in the left hand side of FIG. 2, the description is at first made of the case where the trailing edge of the input pulse $T_1$ leads that of the input pulse $T_2$ by the time t. Further, it is assumed here that a SET pulse is given to the terminal 14 simultaneously with the appearance of the input pulses $T_1$ and $T_2$, as shown in the wave forms (a), (b) and (c). Since the pulses $T_1$ and $T_2$ are applied to the R terminals of the flip-flops 10 and 12 through the respective inverters, both the flip-flops 10 and 12 are set by the SET pulse to produce the set-state output at the respective Q terminals. The $\overline{Q}$ terminals of the flip-flops 10 and 12 change their state from the reset-state to the zero state, so that the signals $T_4$ and $T_6$ changes from the high level to the low level, as shown in the wave forms (e) and (g). After the time d from the appearance of the pulses $T_1$ and $T_2$, the output occurs from the delay elements 20 and 22, so that the signals $T_3$ and $T_5$ change from the low level to the high level, as shown in the wave forms (d) and (f). The pulse $T_1$ disappears after a certain period, so that the flip-flop 10 is reset by the trailing edge of the pulse $T_1$ and the output of the $\overline{Q}$ terminal thereof, i.e. the signal $T_4$, changes from the low level to the high level again, as shown in the wave form (e). The pulse $T_2$ disappears after the time t from the disappearance of the pulse $T_1$, so that, in the same manner as described above, the flip-flop 12 is reset by the trailing edge of the pulse $T_2$ and the output of the $\overline{Q}$ terminal thereof, i.e. the signal $T_6$, changes from the low level to the high level, as shown in the wave form (g). After the delay time d from the disappearance of the pulse $T_2$, the output of the delay element 22, i.e. the signal $T_5$, changes from the high level to the low level, as shown in the wave form (f).

As is understood from comparing the wave form (d) with the wave form (g), there is no duration for which the signals $T_3$ and $T_6$ exist simultaneously. On the other hand, the signals $T_4$ and $T_5$ exist for the certain duration, so that the AND gate 26 produces the output $T_8$, as shown in the wave form (i). The above mentioned certain duration is from the time point when the signal $T_4$ occurs simultaneously with the disappearance of the pulse $T_1$ to the time point when the signal $T_5$ disappears after the delay time d from the disappearance of the pulse $T_2$. Accordingly, this certainduration, which results in the pulse width of the output $T_8$, is equal to the sum of the time difference t between the trailing edges of the pulses $T_1$ and $T_2$ and the delay time d of the delay element 20 or 22.

The case where the pulse $T_1$ matchs $T_2$ in phase is shown in the wave forms (a) to (i) of the right hand side of FIG. 2. As is apparent from these wave forms, both the AND gates 24 and 26 produce the output pulses in the matched phase condition. The pulse width of the output pulses is equal to the delay time d, as shown in the wave forms (h) and (i). Further, if the pulse $T_2$ leads the pulse $T_1$ slightly, but less than the delay time d, the pulse width of the output of the AND gate 24, i.e. the output signal $T_7$, becomes wider to the extent to which the pulse $T_2$ leads the pulse $T_1$. On the other hand, the pulse width of the output of the AND gate 26, i.e. the output signal $T_8$, becomes narrow to the same extent. If the pulse $T_2$ leads the pulse $T_1$ still more and the phase difference therebetween exceeds the delay time d, the signal $T_8$ disappears and only the signal $T_7$ exists, the width of which, in the same manner as mentioned in the description of the wave forms of the left hand side of FIG. 2, is equal to the sum of the phase difference between the trailing edges of the pulses $T_2$ and $T_1$ and the delay time d of the delay element 20 or 22.

In the above description, the pulses SET, $T_1$ and $T_2$ occurs simultaneously. There is, however, no need therefor. It should be noted that information as an input signal is carried by the trailing edge of the pulse $T_1$ or $T_2$. Accordingly, it is sufficient to the purpose of the present invention that the SET pulse occurs before the information carrying part of the input signal appears.

Namely, the flip-flop 10 or 12 must be in the condition that its state can be changed by the input signal.

Figure 3A:
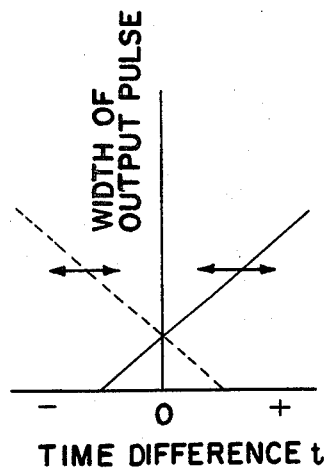
FIGS. 3a and 3b represent the total output characteristics of the embodiment shown in FIG. 1.
Figure 3B:
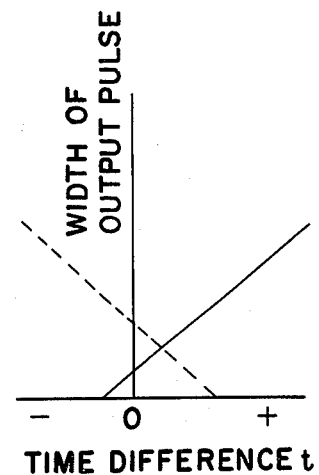

It will be understood that the above explanation that the total output characteristics of the phase difference detector mentioned above becomes as shown in FIG. 3a. In this figure, the solid line indicates the change of the pulse width of the signal $T_8$ and the broken line indicates that the signal $T_7$. As is apparent from the figure, there is no nonsensitive zone in this phase difference detector. Further, if the delay time d of the delay elements 20 and 22 is changed, both the output characteristics shift in parallel, as shown by arrows. If the changed amount of the delay time in the respective delay elements 20 and 22 differs from each other, the total output characteristics of the detector becomes as shown in FIG. 3b.

Figure 4:
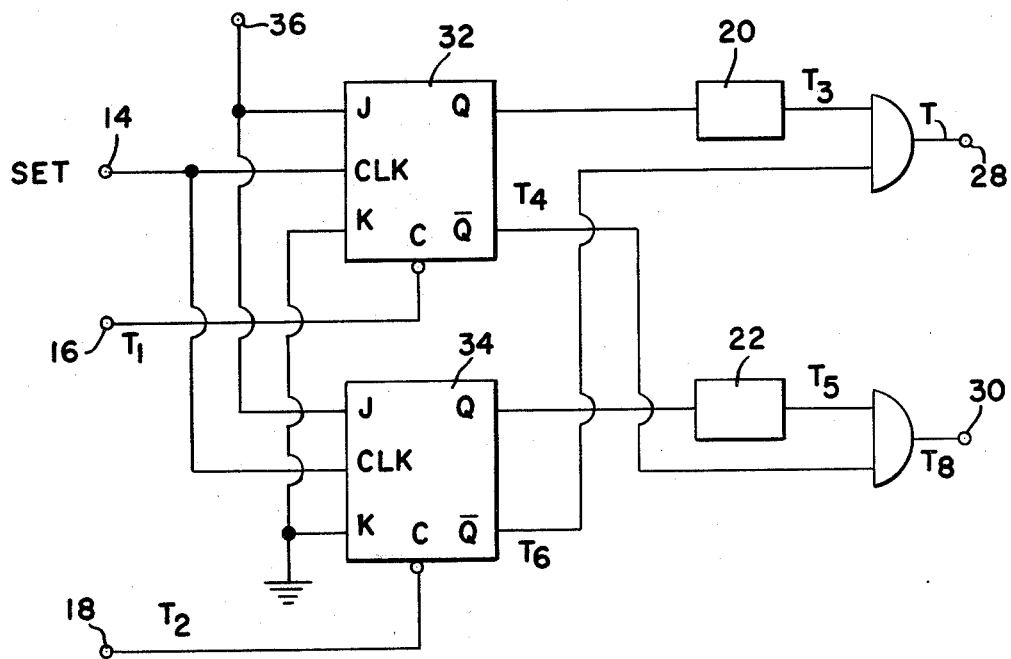
FIG. 4 shows a schematic diagram of the phase difference detector in accordance with another embodiment of the present invention.

In FIG. 4, there is shown another embodiment, in which a pair of J-K flip-flops 32 and 34 are utilized. J terminals of the flip-flops 32 and 34 are connected together to a terminal 36 to which a constant voltage Vcc is applied, and the terminals thereof are both grounded. Clock terminals CKL of the flip-flops 32 and 34 are supplied with the SET signal. The two input pulses $T_1$ and $T_2$ which are applied to the terminals 16 and 18 are led to clear terminals C of the flip-flops 32 and 34 through inverters, respectively. Since the J terminal is alway provided with the constant voltage Vcc and the K terminal is grounded, both flip-flops 32 and 34 are set at once, when the SET pulse is applied to the CLK terminal. The flip-flop 32 or 34 which is in the set-state is forced to reset by the trailing edge of the input pulse $T_1$ or $T_2$, since the pulses $T_1$ and $T_2$ are applied to the respective C terminals through an inverter. These J-K flip-flops 32 and 34 in this embodiment operate in the same manner as the R-S flip-flops 10 and 12 of the embodiment shown in FIG. 1. The Q and $\overline{Q}$ terminals of the flip-flops 32 and 34, therefore, produce output pulses having the same time relationship with respect to the SET, $T_1$ and $T_2$ pulses as the output pulses produced from the Q and $\overline{Q}$ terminals of the flip-flops 10 and 12. These output pulses are processed by the same logic circuit as in the embodiment of FIG. 1. Accordingly, the operation of the embodiment of FIG. 4 can be understood by reference to FIG. 2.

As will be obvious from the above description, there is no nonsensitive zone in the phase difference detector according to the present invention. Furthermore, each input pulse $T_1$ or $T_2$ is utilized only for changing the state of either of a pair of flip-flops. Namely, only one load is connected to one signal source. The load against the signal source is light, so that the delay or distortion in the wave form of the input pulse is significantly reduced. According to the phase difference detector of the present invention, a very small phase difference, e.g. less than one nanosecond, can be detected with high accuracy.

We claim:
1. A phase detector comprising:
first and second input signal sources providing first and second input signals both of which signals rise at the same time;
a first bistable element having first and second output states coupled to the first input signal source wherein said first bistable element is switched from said first state to said second state at the leading edge of said first input signal;
first means for delaying said second state output signal of said first bistable element by a first predetermined time;
a second bistable element having first and second output states and coupled to the second signal source wherein said second bistable element is switched from said first state to said second state at the leading edge of said second input signal; and
second means for producing an output pulse at the coincidence of said first-state output of the second bistable element when said second bistable element reswitches from said second state back to said first state at the trailing edge of said second input signal and the output of said first means which is delayed by the first predetermined time, the pulse length of said second means output pulse being determined by the trailing edge of said delayed output signal of said first means.

2. A phase difference detector as claimed in claim 1, further comprising:
third means for delaying said second state output signal of the second bistable element by a second predetermined time; and
fourth means of producing an output pulse at the coincidence of the first-state output of the first bistable element when said first bistable element reswitches from said second state back to said first state at the trailing edge of said first input signal and the output of said third means which is delayed by the second predetermined time, the pulse length of said fourth means output pulse determined by the trailing edge of said delayed output signal of said third means.

3. A phase difference detector as claimed in claim 2, wherein the second predetermined time is equal to the first predetermined time 4. A phase difference detector as claimed in claim 3, wherein the second predetermined time is different from the first predetermined time.

5. A phase difference detector as claimed in claim 1, wherein the first and second input signals are supplied to the first and second inverters, respectively, so that leading edge of each of the first and second input signals respectively switches the bistable elements from their first to their second states.

* * * * *